(12) United States Patent
Lou et al.

(10) Patent No.: US 7,057,451 B2
(45) Date of Patent: Jun. 6, 2006

(54) PROGRAMMABLE/TUNABLE ACTIVE RC FILTER

(75) Inventors: Chih-Hong Lou, I-Lan (TW); Hung-I Chen, Kaohsiung (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/919,234

(22) Filed: Aug. 17, 2004

(65) Prior Publication Data

US 2005/0242872 A1    Nov. 3, 2005

(30) Foreign Application Priority Data

Apr. 30, 2004   (TW) ............................... 93112280 A

(51) Int. Cl.
*H03K 5/00*    (2006.01)
(52) U.S. Cl. ........................................ 327/553; 327/552
(58) Field of Classification Search ........ 327/552–559; 330/303, 305
See application file for complete search history.

(56) References Cited

U.S. PATENT DOCUMENTS

| | | | | | |
|---|---|---|---|---|---|
| 5,455,582 | A | * | 10/1995 | Valdenaire | 341/154 |
| 6,046,632 | A | * | 4/2000 | Straw | 330/2 |
| 6,366,161 | B1 | * | 4/2002 | Koazechi | 327/553 |
| 6,492,876 | B1 | * | 12/2002 | Kamal et al. | 330/304 |
| 6,583,662 | B1 | * | 6/2003 | Lim | 327/553 |

* cited by examiner

*Primary Examiner*—Dinh T. Le
(74) *Attorney, Agent, or Firm*—Rosenberg, Klein & Lee

(57) ABSTRACT

A programmable/tunable active low-pass filter at least has the resistors, capacitors and shunt control means. It uses the resistor ladder that is structured with various fixed resistors to implement the shunt control means. The cut-off frequency of a filter is associated with the time constant, which is determined by equivalent resistance and equivalent capacitance value in the filter circuit; therefore, the filter of the present invention allowed users to fine tune the cut-off frequency linearly through the shunt control means when the variation of the environment or process parameters of manufacture cause the cut-off frequency drift, thus, the cut-off frequency can be kept in a constant value. The present invention also provides a means for programming the cut-off frequency to a desirous frequency value dependent upon the conditions of application within a big range. Thus, it can be used in many purposes widely with the same filter circuit.

25 Claims, 5 Drawing Sheets

PROGRAMMABLE/TUNABLE ACTIVE RC FILTER

BACKGROUND OF THE PRESENT INVENTION

1. Field of the Invention

The invention generally relates to analog filter circuits, and more particularly to a method and apparatus for fine tuning and adjusting the cut-off frequency and voltage gain of an active filter.

2. Description of the Prior Art

A filter is an important and familiar component in signal processing systems; and the purpose of the filter is to eliminate the band signals unwanted for retaining and amplifying the band signals desired. Integrating the filters into one chip is a common trend in the manufacture process of the advanced integrated circuit, especially to the communication markets. As the communication system continuously develops, the signal-processing circuits not only require high performances, but also should have a multi-function for a system to process different types of signals. For instance, the 2nd/3rd generation cell phone in wireless communication and V/ADSL (i.e. very high data/asymmetrical digital subscriber line) modem in wired communication, they all require the filters that can be switched in the both systems. Therefore, how to design a filter, which can program the cut-off frequency to an accurate value within a large range, is a main key point in today's signal processes of the communication systems.

The cut-off frequency of a filter is in direct proportion to the reciprocal of time constant $\tau$ (i.e. $f=1/2\pi\tau$), and the time constant r is the product of equivalent resistance and capacitance (i.e. $\tau=R\times C$) of the active RC filter. In general, the programmable active RC filters finely tune the value of the cut-off frequency by adjusting the number of operative cells of the resistance or the capacitance. FIG. 1A depicts a conventional programmable filter with a selective parallel-capacitor circuit structure, the situations (off and on) of the switch devices b0, b1, b2, b3 can determine whether the capacitors connected with the filter are operative or not. Since each of the capacitors is connected in parallel, so that the equivalent capacitance of the filter circuit can be obtained by adding the capacitance of the capacitors connected with the switch devices b0, b1, b2, b3 that is operative. For instance, the equivalent capacitance of the circuit is 0 when the switch devices b0, b1, b2, b3 are all turned off; similarly, the equivalent capacitance of the circuit is 15C when the switch devices b0, b1, b2, b3 are all turned on. Thus, the combination of the switch devices b0, b1, b2, b3 is the control code of the circuit that can be used to control the equivalent capacitance of the filter and then can achieve the purpose of fine tuning the cut-off frequency. In addition, it can also obtain the same purpose by using the selective parallel-resistor circuit (referring to FIG. 1B) or the selective series-resistor circuit (referring to FIG. 1C) structure to substitute for resistor R1 in FIG. 1A.

According to the fundamental principle of active filters, the cut-off frequency is in direct proportion to the reciprocal of the product of equivalent resistance and equivalent capacitance of the circuit (i.e. $f=1/2\pi\tau=1/(2\pi R\times C)$). Hence, the relation between the control code and the cut-off frequency of the filter is non-linear regardless of equivalent resistance or equivalent capacitance is tuned, which is shown in FIG. 2A. In applications, besides, when the cut-off frequency is required that being adjusted within certain accuracy, the number of control bits will be determined by the largest slope parts in FIG. 2A. It is therefore that, it will increase the number of devices of the circuits and reduce the control efficiency; thus, it will make it become difficult to design in an integrated circuit. In addition, since the cut-off frequency of such kind of filters can only be tuned within a fixed range, the applications of that are limited in the kind of filters.

Accordingly, it can become a linear relation (as is shown in FIG. 2B) between the control code and the cut-off frequency by making the relations between the control code and the reciprocal of equivalent resistance (i.e. the equivalent conductance) of the filter become more linear. Therefore, it can not only increase the control efficiency and reduce the area of the circuits, but also extend the tuning range of cut-off frequency and add the applications of the circuits for the multi-function purpose.

SUMMARY OF THE PRESENT INVENTION

As is described above, the problems of techniques in the prior art are limited in applications, and with low control efficiency and large circuit area; thus, one of the purposes of the present invention is to provide a filter circuit having an utility of tuning the cut-off frequency; in this regard, it can make the cut-off frequency be shifted within a tuning rage and be tuned to a desired band according to the practical applications for achieving the multi-function purpose.

Another one of the purposes of the present invention is to provide a filter circuit having an utility of tuning the cut-off frequency that can narrow the tuning range of the cut-off frequency and increase the level of tuning accuracy with a constant number of control bits for achieving a higher control resolution.

Still another one of the purposes of the present invention is to provide a fine tune apparatus having a linear relation with the cut-off frequency of a filter circuit; in this regard, it can precisely tune the cut-off frequency to a desired value for compensating the parameter variations due to the manufacture process or the environments. Besides, it has a smaller circuit area under the same accuracy.

Still another one of the purposes of the present invention is to provide a voltage gain tuning apparatus of a filter for tuning the voltage gain after the tuning of the cut-off frequency are tuned.

DESCRIPTION OF THE PREFERRED EMBODIMENT

The following descriptions about the circuit of present invention not include the complete structure of the active filter. It just quotes the key points of traditional techniques for illustrates the present invention. Moreover, all of the drawings relates to the present invention don't accord the scale, they are just used to represent the characteristics of structure of present invention.

Figure 3:
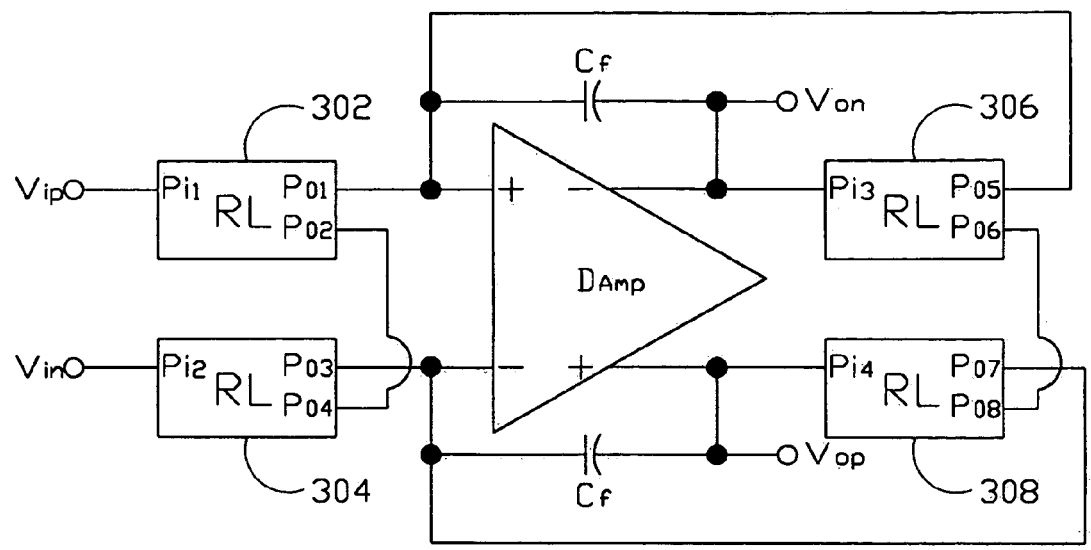
FIG. 3 is a circuit diagram of an improved active filter.

FIG. 3 depicts an improved active filter circuit according to the present invention. The circuit is composed of a differential amplifier $D_{Amp}$ with two input terminals and two output terminals, which are respectively connected to the four controllable shunt devices 302, 304, 306 and 308 (for instance, resistor ladders, RL); and two identical capacitance component $C_f$, wherein each of the switch devices respectively used in controllable shunt devices 302, 304, 306 and 308 are exactly the same. The voltage signal inputted from the input terminals of the filter can be transformed into a current signal by means of the equivalent resistance of the controllable shunt devices 302 and 304. The controllable shunt devices can be controlled by the situations (on and off) of each switch device for achieving the purpose of operating under shunt control. Furthermore, the switch devices can be controlled synchronously by the system attached (for instance, digital mobile phone system); otherwise, they can be controlled individually (i.e. asynchronously).

Figure 4:
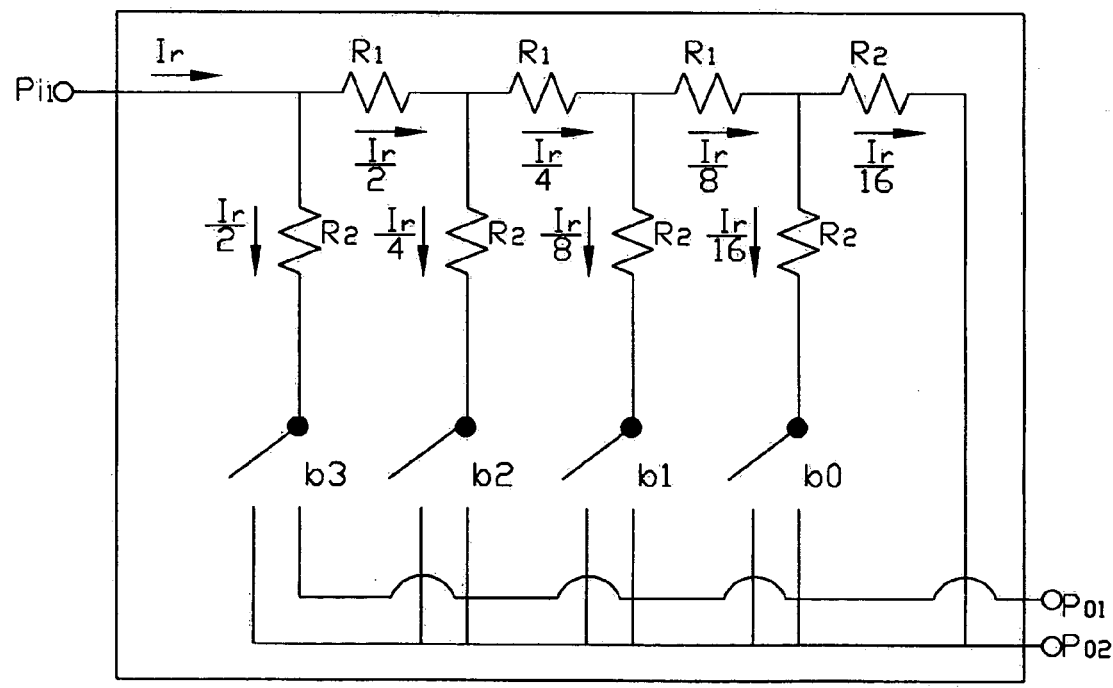
FIG. 4 is a circuit diagram of the four degrees resistor ladder construct.

FIG. 4 depicts a four-degree R-2R resistor ladder, which is composed of two resistors (R1, R2) and four switch devices (b3, b2, b2, b0), wherein the resistance of R2 is twice as big as the resistance of R1. In the embodiment, the controllable shunt devices (302, 304, 306, 308) of the active filter circuit according to the present invention are implemented by four R-2R resistor ladders with a single input terminal and two output terminals. Further, it utilizes the same set of control code to control the on and off situations of the switch devices (b3, b2, b1, b0) in the controllable shunt device (302, 304, 306, 308) synchronously. Besides, all switch devices of the embodiment are implemented by the three-terminal devices with the same property; for instance, the field effect transistors (FETs) with the same physical size. Since the field effect transistors and the controllable shunt devices are manufactured by the same manufacturing process, and the operating environments of them are coincident; thus, the mismatch effect between the equivalent resistances caused by the body effects will not appear.

Next, referring now to FIG. 3, each of the input terminals $P_{i1}$, $P_{i2}$ of the controllable shunt devices 302, 304 is respectively connected to the input terminals $V_{ip}$, $V_{in}$ of the circuit; each of the output terminals $P_{o1}$, $P_{o3}$ of the controllable shunt devices 302, 304 is respectively connected to the positive and the negative input terminals of differential amplifier $D_{Amp}$; and each of another output terminals $P_{o2}$, $P_{o4}$ of the controllable shunt devices 302, 304 connects to each other for generating a loop. Further, the input terminal $P_{i3}$ of the controllable shunt device 306 is connected to the output terminal $V_{on}$ of the circuit and the negative output terminal of the differential amplifier $D_{Amp}$; while the input terminal $P_{i4}$ of the controllable shunt device 308 is connected to the output terminal $V_{op}$ of the circuit and the positive output terminal of the differential amplifier $D_{Amp}$. Each of the output terminals $P_{o5}$, $P_{o7}$ of the controllable shunt devices 306, 308 feeds back to the positive and negative input terminals of the differential amplifier $D_{Amp}$; and similarly, each of another output terminals $P_{o6}$, $P_{o8}$ of the controllable shunt devices 306, 308 connects to each other for generating a loop. Besides, each of the two capacitors $C_f$ is respectively connected to the input terminals and the output terminals of the differential amplifier $D_{Amp}$. Accordingly, it can linearly control the current magnitude of the equivalent signals by changing the switches of the resistor ladders, and it can further linearly control the cut-off frequency of the active filter. In this regard, it can be seen in the following analysis.

By using the equivalent half-circuit analysis method to analyze the circuit in FIG. 3 and draw the signal flow graph (i.e. SFG); thus, the following transfer function can be obtained:

$$\frac{Vo}{Vi} = \frac{-\frac{a}{RL \cdot Cf}}{S + \frac{a}{RL \cdot Cf}}$$

wherein $V_o$ is the differential output signal (i.e. $V_o = V_{op} - V_{on}$); $V_i$ is the differential input signal (i.e. $V_i = V_{ip} - V_{in}$); S is a frequency domain variable after the Fourier transform of the time domain; parameter "a" is the ratio of the current flowing out of the output terminal $P_{o1}$ of the RL circuit in FIG. 4 to current $I_r$; thus, the variable range of the parameter a is 0, 1/16, 2/16, ..., 14/16, 15/16. Regarding the resistor R2 that the current $I_r/16$ passed through, if the terminal connected to the output terminal $P_{o2}$ is changed to being connected to the output terminal $P_{o1}$, then the variable range of the parameter a is 1/16, 2/16, ..., 15/16, 16/16. According to the above-mentioned equation, the cut-off frequency ω of the filter is:

$$\omega = \frac{a}{RL \cdot Cf} \text{ (rad/s)}$$

Since the parameter a has a linear variation with the switch devices b3, b2, b1, b0; thus, there has a linear relation between the cut-off frequency ω and switch devices b3, b2, b1, b0 of the filter. For instance:

when $a = 0$, $\omega = 0$ (rad/s)

when $a = 1$, $\omega = \frac{1}{Cf \cdot RL}$ (rad/s)

Figure 1A:
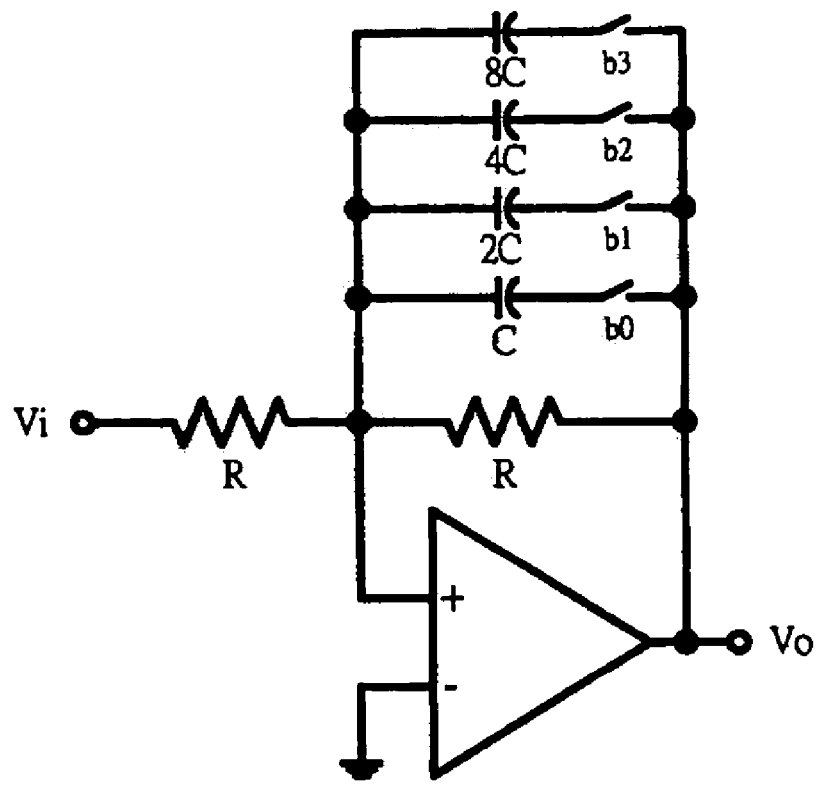
FIG. 1A is a circuit diagram of the active filter with selective parallel-capacitor construct.
Figure 1B:
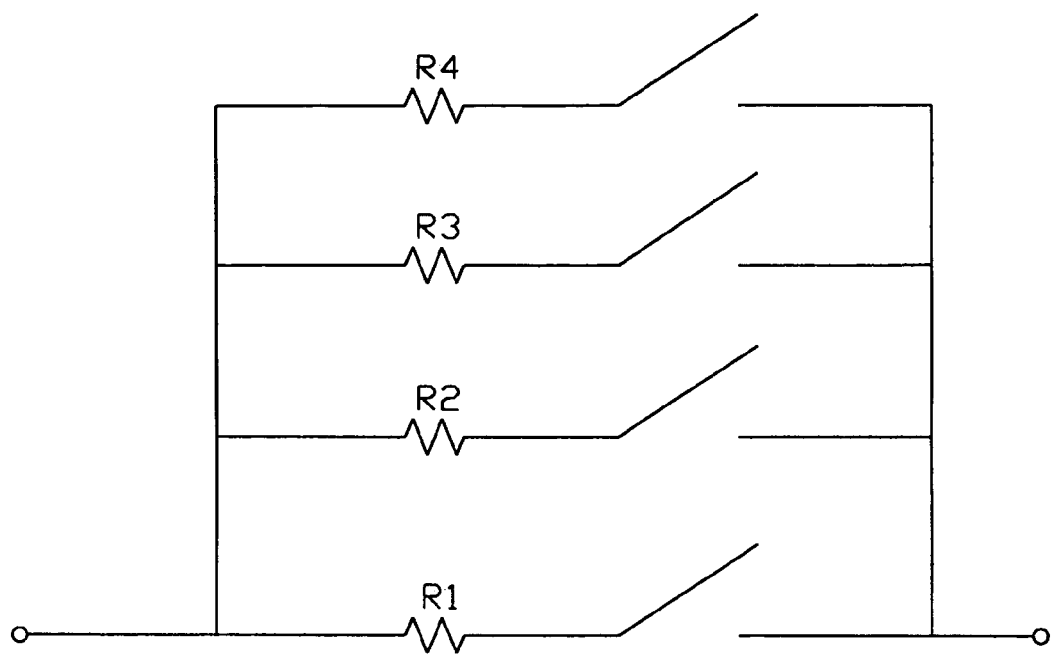
FIG. 1B is a circuit diagram of the selective parallel-resistor construct.
Figure 1C:
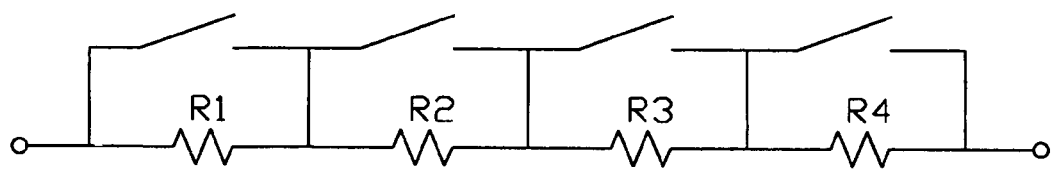
FIG. 1C is a circuit diagram of the selective series-resistor construct.
Figure 2A:
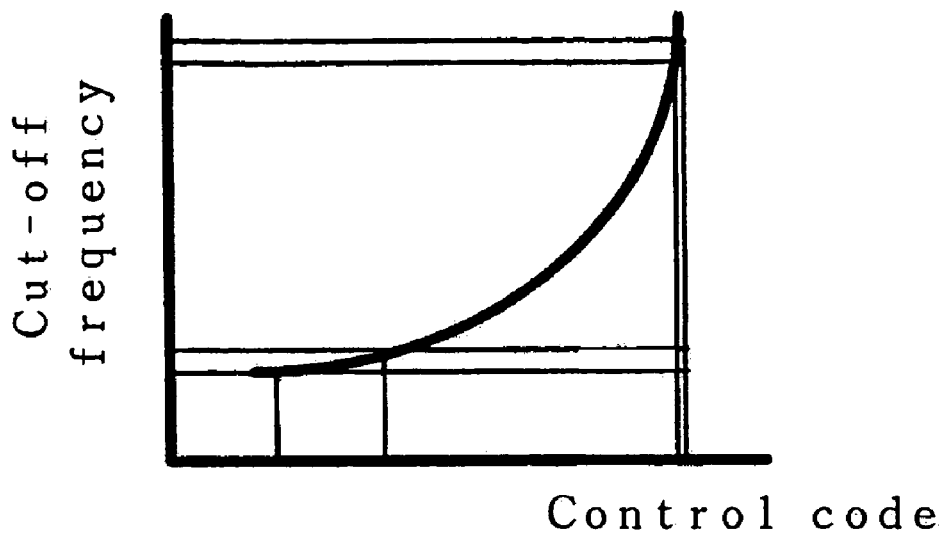
FIG. 2A is a relation diagram between the cut-off frequency and control code of the general active filters.
Figure 2B:
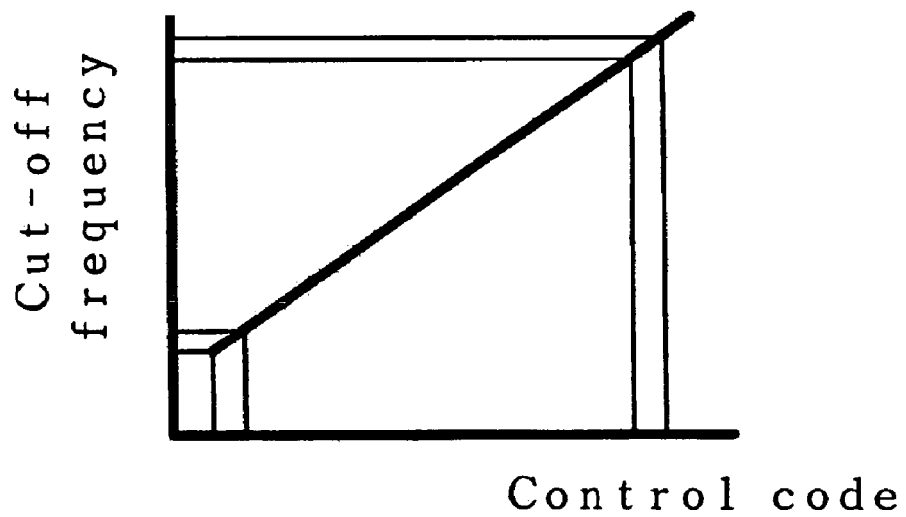
FIG. 2B is a relation diagram between the cut-off frequency and control code of the present invention.
Figure 5:
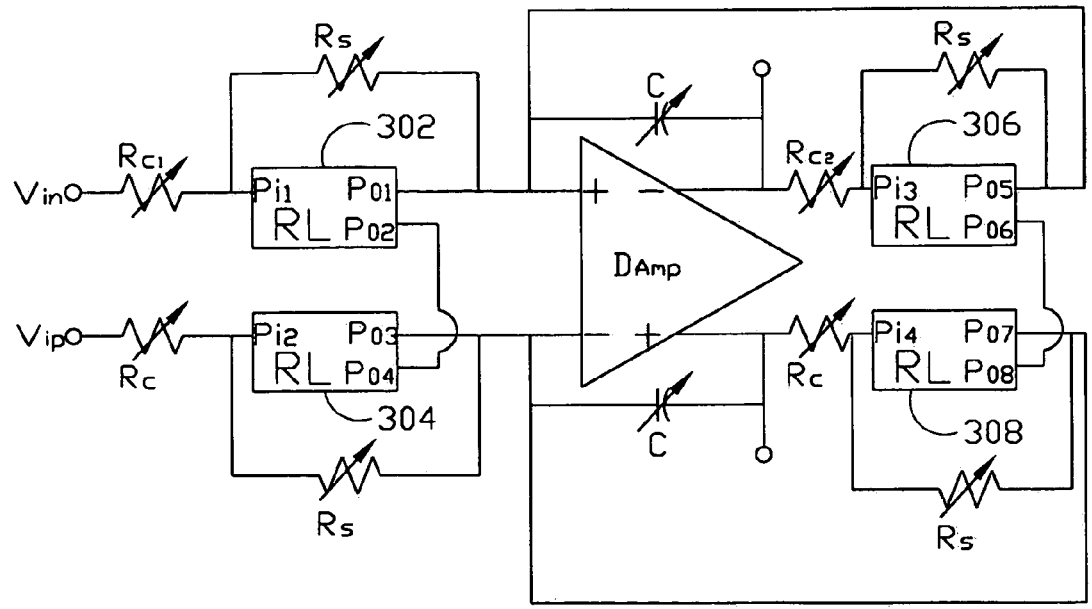
FIG. 5 is a circuit diagram of an embodiment according to the present invention.

FIG. 5 depicts another preferred embodiment of the present invention. First, four variable resistors $R_s$ are used to respectively connect the input terminals $P_{i1}$, $P_{i2}$, $P_{i3}$, $P_{i4}$ and the output terminals $P_{o1}$, $P_{o3}$, $P_{o5}$, $P_{o7}$ of the controllable shunt devices 302, 304, 306, 308, and a variable resistor $R_c$ is used to cascade the above-mentioned terminals; wherein the parallel variable resistors $R_s$ and the series variable resistors $R_c$ can be selectively implemented by the resistor ladders, the selective parallel-resistor structure or the selective series-resistor structure. Further, the selective series-resistor structure (as shown in FIG. 1C) is chosen for variable resistor $R_s$ and $R_c$ in this embodiment. Besides, in FIG. 5, $R_c$ is the same circuit structure as $R_{c1}$ and $R_{c2}$ (i.e. $R_c = R_{c1} = R_{c2}$); thus, $R_c$ is used for representing $R_{c1}$ and $R_{c2}$ when under transferring of a transfer function.

By using the equivalent half-circuit analysis method to analyze the circuit in FIG. 5 and draw the signal flow graph (i.e. SFG); thus, the following transfer function can be obtained:

$$\frac{Vo}{Vi} = \frac{-\left(a\frac{Rs}{Rs+RL} + \frac{RL}{Rs+RL}\right)}{C\left(Rc + \frac{Rs \cdot RL}{Rs+RL}\right)}}{S + \frac{\left(a\frac{Rs}{Rs+RL} + \frac{RL}{Rs+RL}\right)}{C\left(Rc + \frac{Rs \cdot RL}{Rs+RL}\right)}}$$

wherein the cut-off frequency ω of the filter is:

$$\omega = \frac{a\frac{Rs}{Rs+RL} + \frac{RL}{Rs+RL}}{C\left(Rc + \frac{Rs \cdot RL}{Rs+RL}\right)} \text{ (rad/s) and}$$

when $a = 0$, $\omega = \dfrac{1}{C\left(Rs + Rc\dfrac{RL+Rs}{RL}\right)}$ (rad/s)

when $a = 1$, $\omega = \dfrac{1}{C\left(Rc + \dfrac{Rs \cdot RL}{Rs+RL}\right)}$ (rad/s)

According to the above-described equation, the cut-off frequency still has a linear variation with the switch devices b3, b2, b1, b0. It can also be appreciated that the slope of the linear variation of the cut-off frequency relative to the parameter "a" is direct proportion to $R_s/(R_s+RL)$; it is therefore that the tuning range of the cut-off frequency can be controlled by an appropriate design of the ratio between the variable resistor $R_c$ and the equivalent resistance of the resistor ladder RL. Next, the cut-off frequency can be lowered by increasing the resistance of the variable resistor $R_c$; adjust the cut-off frequency of the filter to a frequency band by tuning the resistance of the variable resistor $R_c$ and it is therefore that the filter can be suitable for the multi-operation modes system structure. In addition, it is an inverse proportion between the variable resistor $R_c$ and the equivalent resistance of the resistor ladder RL when the cut-off frequency is the same; that is, the equivalent resistance of the resistor ladder RL can be lowered (i.e. the resistances of R1 and R2 of the resistor ladder RL can be reduced) when the resistance of the variable resistor $R_c$ is increased; accordingly, the area of the circuit will be greatly reduced. Besides, when tuning the resistance during the manufacture process of the integrated circuit, the variable resistors $R_c$ and $R_s$ can be trimmed by means of a trimming method (for instance, laser trimming) for achieving the purpose of fine tuning; and there is no need to synchronously trim all resistors of R-2R resistor ladders.

As the above-mentioned descriptions, when the filter circuit in FIG. 5 is under operation, the cut-off frequency of the filter can be positioned to a desired band by tuning the series variable resistors at first; further, it is determined as regards the application fields. For instance, when a filter is applied to a component of a GSM/CDMA (i.e. global standard for mobile/code division multiple access) dual module system, the cut-off frequency can be positioned in a frequency band that is determined by series variable resistors $R_c$. The frequency band is adjusted to a frequency band or selected in a wireless communication; for instance, to a GSM/CDMA dual module system, the frequency band is GSM band or CDMA band. Further, to narrow the tuning range of the cut-off frequency by tuning the parallel variable resistors $R_s$, and then the cut-off frequency can approach to the desired value and the control resolution can be increased too. Moreover, control the switch devices (b3, b2, b1, b0) of the controllable shunt devices (306, 308) by using the control code for fine tuning the cut-frequency to a desired value. And then, the signal outputted from the filter can be sent to the transceiver of the dual module system. Finally, when the cut-off frequency has been tuned to a desired value, adjust the control switch devices (b3, b2, b1, b0) of the controllable shunt devices (302, 304) for programming the voltage gain of the active RC filter.

In addition, in the embodiment of FIG. 5, there is an alternative method that tuning the parallel variable resistors $R_s$ and then tuning the series resistors $R_c$. In the embodiment of the present invention, the method that tuning the series resistors $R_c$ and then tuning the parallel variable resistors $R_s$ is chosen. Further, about tuning the cut-off frequency, there is an alternative method that tuning the selective parallel-capacitor circuit (as shown in FIG. 1A). However, since the selective parallel-capacitor circuit would cause nonlinear effects, so that the embodiment adopts the method that tuning the resistors for achieving the purpose of fine tuning.

Besides, since assuming that the controllable shunt devices (302, 304, 306 and 308) are fully the same R-2R resistor ladders and each of them is controlled by means of a synchronous control method; according to the principle of the active filters, it is realized that the voltage gain of the circuit is a fixed value. Accordingly, when the cut-off frequency is finely tuned to a desired value and then being fixed, thus controlling of the controllable shunt devices 306, 308 can be stopped. Next, to synchronously control the control switch devices (b3, b2, b1, b0) of the controllable shunt devices (302, 304) for further changing the equivalent resistance of the controllable shunt device 302 or 304; therefore, it can adjust the voltage gain of the active RC filter for the purpose of adjustable, programmable and changeable tuning of the voltage gain. Further, according to the circuit structure, it is realized that when the filter circuit has finished frequency tuning, it can also achieve the purpose of adjustable, programmable and changeable tuning of the voltage gain by only tuning the resistor $R_{c1}$.

Figure 6:
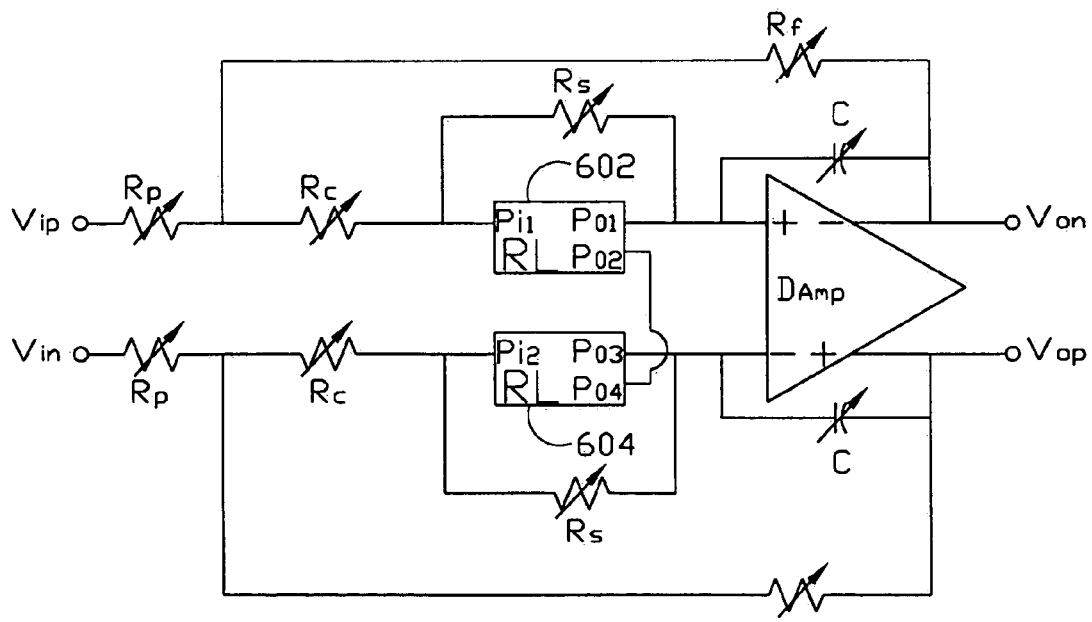
FIG. 6 is a circuit diagram of an embodiment according to the present invention.

FIG. 6 depicts another preferred embodiment of the present invention. It is an altered circuit of the circuit in FIG. 5 for simplifying the control procedure; wherein the number of the controllable shunt devices is simplified from four to two (i.e. 602 and 604 in FIG. 6). Further, the structure of that is the same as the R-2R resistor ladders of FIG. 4, and each of the two variable resistors $R_p$ is respectively connected to the two input terminals $V_{ip}$, $V_{in}$ and then each of the two variable resistors $R_f$ feeds back between $R_p$ and $R_c$ through the two output terminals $V_{op}$, $V_{on}$. Similarly, the variable resistors $R_f$ and $R_p$ can be implemented by the resistor ladders, the selective parallel-resistor structure (such as the circuit shown in FIG. 1B) or the selective series-resistor structure (such as the circuit shown in FIG. 1C). In the embodiment, the variable resistors $R_f$ and $R_p$ are implemented by selective series-resistor circuits for reducing the numbers and the area of resistor ladders.

By using the equivalent half-circuit analysis method to analyze the circuit in FIG. 6 and draw the signal flow graph (i.e. SFG); thus, the following transfer function can be obtained:

$$\frac{Vo}{Vi} = \frac{-\frac{Rf}{Rp} \cdot \frac{Rp}{Rp+Rf}\left(a\frac{Rs}{Rs+RL} + \frac{RL}{Rs+RL}\right)}{S + \frac{\frac{Rp}{Rp+Rf}\left(a\frac{Rs}{Rs+RL} + \frac{RL}{Rs+RL}\right)}{C\left(Rc + \frac{Rs \cdot RL}{Rs+RL} + \frac{Rp \cdot Rf}{Rs+RL}\right)}}$$

wherein the cut-off frequency ω of filter is:

$$\omega = \frac{\frac{Rp}{Rp+Rf}\left(a\frac{Rs}{Rs+RL} + \frac{RL}{Rs+RL}\right)}{C\left(Rc + \frac{Rs \cdot RL}{Rs+RL} + \frac{Rp \cdot Rf}{Rp+Rf}\right)} \text{ (rad/s) and}$$

when $a = 0$, $$\omega = \frac{1}{C\left[Rc\left(1+\frac{Rf}{Rp}\right)\cdot\left(1+\frac{Rs}{RL}\right) + Rs\left(1+\frac{Rf}{Rp}\right) + Rf\left(1+\frac{Rs}{RL}\right)\right]} \text{ (rad/s)}$$

when $a = 1$, $\omega = \dfrac{1}{C\left[\left(Rc + \dfrac{Rs \cdot RL}{Rs+RL} + Rc\right)\cdot \dfrac{Rp+Rf}{Rp} + Rf\right]}$ (rad/s)

According to the above-described equation, it can be appreciated that the circuit has the same properties with the circuit in FIG. 5. Further, there are only two controllable shunt devices used to tune the cut-off frequency of the filter; thus, it can greatly reduce the area and complexity of the circuit. And next, the direct voltage gain of the filter can be tuned by the resistances of the variable resistors $R_f$ and $R_p$; thus, The direct voltage gain of the filter can be tuned by the resistances of the two variable resistors. In the embodiment of the present invention, $R_p$ is chosen for tuning the direct voltage gain of the filter.

Besides, when the cut-off frequency is fixed, higher direct voltage gain of the filter makes smaller resistance $R_p$ that is needed; therefore, the area of the circuit can be reduced greatly. Similarly, the tuning range of the cut-off frequency can be controlled by an appropriate design of the ratio between the variable resistor $R_c$ and the equivalent resistance of the resistor ladder RL. Then, adjust the cut-off frequency of the filter to a frequency band by tuning the resistance of the variable resistor $R_c$ and it is therefore that the filter can be suitable for the multi-operation modes system structure.

Finally, since the noise frequency spectrum density of the filter circuit is determined by the equivalent resistance; thus, when the operation band of the filter is needed to change in a wide range, tuning of the equivalent capacitance is available to avoid the substantial variation of the noise frequency spectrum density caused by tuning of the equivalent resistance. Accordingly, the capacitance components in the circuits of FIG. 5 and FIG. 6 are implemented by a variable capacitor "C". All of the variable capacitors and resistors in the embodiments of the present invention can be implement by any prior arts; for instance, the selective parallel-capacitance structure shown in FIG. 1A, the selective parallel-resistor structure shown in FIG. 1B and the selective series-resistor structure shown in FIG. 1C.

The types of the variable resistor apparatus in the present invention are not restricted except the controllable shunt devices (should be implemented by the resistor ladder circuits), and it can be implemented by the resistor ladders, selective parallel-resistor and selective series-resistor circuits according to the criterion of the designer. The embodiment in FIG. 5 can be adopted when the filter circuit needs a precise cut-off frequency, and the embodiment in FIG. 6 can be adopted when the filter circuit needs a simpler control procedure and a smaller size.

While this invention has been described with reference to illustrative embodiments, this description does not intend or construe in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A programmable/tunable active RC filter, comprising:
a first controllable shunt device having an input terminal, a first output terminal and a second output terminal, wherein said input terminal of said first controllable shunt device is connected to a first input signal;
a second controllable shunt device having an input terminal, a first output terminal and a second output terminal, wherein said input terminal of said second controllable shunt device is connected to a second input signal, and said second output terminal of said second controllable shunt device is connected to said second output terminal of said first controllable shunt device;
a third controllable shunt device having an input terminal, a first output terminal and a second output terminal;
a fourth controllable shunt device having an input terminal, a first output terminal and a second output terminal, wherein said second output terminal of said fourth controllable shunt device is connected to said second output terminal of said third controllable shunt device;
a differential amplifier having two input terminals and two output terminals, wherein each of said two input terminals is respectively connected to each of said first output terminals of said first controllable shunt device, said second controllable shunt device, said third controllable shunt device and said fourth controllable shunt device, each of said two output terminals is respectively connected to each of said input terminals of said third controllable shunt device and said fourth controllable shunt device; and
two capacitors, wherein each of said two capacitors is respectively connected to said two input terminals and said two output terminals of said differential amplifier for forming a RC filter and then being outputted from two output terminals of said two capacitors.

2. The programmable/tunable active RC filter according to claim 1, further comprising two first variable resistors $R_{c1}$, each one end of said two first variable resistors is respectively connected to said first input signal and said second input signal, and each another end of said two first variable resistors is respectively connected to each of said input terminals of said first controllable shunt device and said second controllable shunt device.

3. The programmable/tunable active RC filter according to claim 1, further comprising two second variable resistors $R_{c2}$, each one end of said two second variable resistors is respectively connected to said two output terminals of said differential amplifier, and each another end of said two second variable resistors is respectively connected to each of said input terminals of said third controllable shunt device and said fourth controllable shunt device.

4. The programmable/tunable active RC filter according to claim 1, further comprising four tunable feedback resistors $R_S$, each of said four tunable feedback resistors is respectively connected to said input terminals and said first output terminals of said first controllable shunt device, said second controllable shunt device, said third controllable shunt device and said fourth controllable shunt device.

5. The programmable/tunable active RC filter according to claim 1, wherein said first controllable shunt device, said second controllable shunt device, said third controllable shunt device and said fourth controllable shunt device are resistor ladder circuit structures.

6. The programmable/tunable active RC filter according to claim 2, wherein each of said two first variable resistors is composed of a plurality of parallel-resistors.

7. The programmable/tunable active RC filter according to claim 2, wherein each of said two first variable resistors is composed of a plurality of series-resistors.

8. The programmable/tunable active RC filter according to claim 3, wherein each of said two second variable resistors is composed of a plurality of parallel-resistors.

9. The programmable/tunable active RC filter according to claim 3, wherein each of said two second variable resistors is composed of a plurality of series-resistors.

10. The programmable/tunable active RC filter according to claim 4, wherein each of said four tunable feedback resistors is composed of a plurality of parallel-resistors.

11. The programmable/tunable active RC filter according to claim 4, wherein each of said four tunable feedback resistors is composed of a plurality of series-resistors.

12. The programmable/tunable active RC filter according to claim 1, wherein each of said two capacitors is composed of a plurality of parallel-capacitances.

13. A programmable/tunable active RC filter, comprising:
a first controllable shunt device having an input terminal, a first output terminal and a second output terminal;
a second controllable shunt device having an input terminal, a first output terminal and a second output terminal, wherein said second output terminal of said second controllable shunt device is connected to said second output terminal of said first controllable shunt device;
a differential amplifier having two input terminals and two output terminals, wherein each of said two input terminals is respectively connected to each of said first output terminals of said first controllable shunt device and said second controllable shunt device;
two first variable resistors $R_p$, wherein one end of said two first variable resistors are respectively connected to a first input signal and a second input signal, and another end of said two first variable resistors are respectively connected to said input terminals of said first controllable shunt device and said second controllable shunt device;
two second variable resistors $R_f$, wherein one end of said two second variable resistors are respectively connected to said two output terminals of said differential amplifier, and another end of said two second variable resistors are respectively connected to said input terminals of said first controllable shunt device and said second controllable shunt device; and
two capacitors, wherein each of said two capacitors is respectively connected to said two input terminals and said two output terminals of said differential amplifier for forming a RC filter and being outputted from two output terminals of said two capacitors.

14. The programmable/tunable active RC filter according to claim 13, further comprising:
two third variable resistors $R_S$, one end of said two third variable resistors are respectively connected to said first output terminals of said first controllable shunt device and said second controllable shunt device, and another end of said two third variable resistors feedback to said input terminals of said first controllable shunt device and said second controllable shunt device.

15. The programmable/tunable active RC filter according to claim 13, further comprising:
two fourth variable resistors $R_C$ between said two first variable resistors and said input terminals of said first controllable shunt device and said second controllable shunt device, wherein one end of said two fourth variable resistors is connected to another end of said two first variable resistors, and another end of said two fourth variable resistors is connected to said input terminals of said first controllable shunt device and said second controllable shunt device.

16. The programmable/tunable active RC filter according to claim 13, wherein said first controllable shunt device and said second controllable shunt device are resistor ladder circuit structures.

17. The programmable/tunable active RC filter according to claim 13, wherein each of said two first variable resistors and said two second variable resistors is composed of a plurality of parallel-resistors.

18. The programmable/tunable active RC filter according to claim 13, wherein each of said two first variable resistors and said two second variable resistors is composed of a plurality of series-resistors.

19. The programmable/tunable active RC filter according to claim 14, wherein each of said two third variable resistors is composed of a plurality of parallel-resistors.

20. The programmable/tunable active RC filter according to claim 14, wherein each of said two third variable resistors is composed of a plurality of series-resistors.

21. The programmable/tunable active RC filter according to claim 15, wherein each of said two fourth variable resistors is composed of a plurality of parallel-resistors.

22. The programmable/tunable active RC filter according to claim 15, wherein each of said two fourth variable resistors is composed of a plurality of series-resistors.

23. A dual module portable wireless communication system having a programmable/tunable active RC filter, comprising:
a first controllable shunt device having an input terminal, a first output terminal and a second output terminal;
a second controllable shunt device having an input terminal, a first output terminal and a second output terminal, wherein said second output terminal of said second controllable shunt device is connected to said second output terminal of said first controllable shunt device;
a differential amplifier having two input terminals and two output terminals, wherein each of said two input terminals is respectively connected to each of said first output terminals of said second controllable shunt device and said second controllable shunt device;
two first variable resistors $R_p$, wherein one end of said two first variable resistors are respectively connected to a first input signal and a second input signal, and another end of said two first variable resistors are respectively connected to said input terminals of said first controllable shunt device and said second controllable shunt device;
two second variable resistors $R_f$, wherein one end of said two second variable resistors are respectively connected to said two output terminals of said differential amplifier, and another end of said two second variable resistors are respectively connected to said input terminals of said first controllable shunt device and said second controllable shunt device;

two capacitors, wherein each of said two capacitors is respectively connected to said two input terminals and said two output terminals of said differential amplifier for forming said programmable/tunable RC filter and then being outputted from two output terminals of said two capacitors; and a radio transceiver, wherein said radio transceiver receives the signals outputting from said programmable/tunable active RC filter in said dual module portable wireless communication system.

24. The system according to claim 23, further comprising:
two third variable resistors $R_S$, one end of said two third variable resistors are respectively connected to said first output terminals of said first controllable shunt device and said second controllable shunt device, and another end of said two third variable resistors feedback to said input terminals of said first controllable shunt device and said second controllable shunt device.

25. The system according to claim 23, further comprising:
two fourth variable resistors $R_C$ between said two first variable resistors and said input terminals of said first controllable shunt device and said second controllable shunt device, wherein one end of said two fourth variable resistors is connected to another end of said two first variable resistors, and another end of said two fourth variable resistors is connected to said input terminals of said first controllable shunt device and said second controllable shunt device.

* * * * *